US006274472B1

(12) United States Patent
Hossain et al.

(10) Patent No.: US 6,274,472 B1
(45) Date of Patent: Aug. 14, 2001

(54) TUNGSTEN INTERCONNECT METHOD

(75) Inventors: Timothy Z. Hossain; Amiya R. Ghatak-Roy; Allen Evans, all of Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/489,509

(22) Filed: Jan. 21, 2000

(51) Int. Cl.$^7$ .................................................. H01L 21/44
(52) U.S. Cl. ............................................. 438/598; 438/712
(58) Field of Search ..................................... 438/598, 398, 438/637–641, 672–675, 712

(56) References Cited

U.S. PATENT DOCUMENTS

| | | |
|---|---|---|
| 4,777,150 | 10/1988 | Deneuville et al. . |
| 5,071,788 | 12/1991 | Joshi . |
| 5,158,903 | 10/1992 | Hori et al. . |
| 5,223,455 | 6/1993 | Itoh et al. . |
| 5,472,896 | 12/1995 | Chen et al. . |
| 5,492,734 | * 2/1996 | Matsumoto et al. ................. 427/535 |
| 5,656,529 | * 8/1997 | Fukase ................................ 438/398 |
| 5,795,824 | 8/1998 | Hancock . |
| 5,874,360 | 2/1999 | Wyborn et al. ..................... 438/680 |
| 5,906,866 | 5/1999 | Webb .................................. 427/534 |
| 6,037,263 | 3/2000 | Chang ................................. 438/712 |
| 6,066,366 | 5/2000 | Berenbaum et al. ............... 427/250 |

FOREIGN PATENT DOCUMENTS

| | | | |
|---|---|---|---|
| 0068843 A2 | 1/1983 | (EP) | ............................. H01L/21/285 |
| 07263674 | 10/1995 | (EP) | ............................. H01L/29/78 |
| 2061615 A | 5/1981 | (GB) | ............................. H01L/29/62 |

OTHER PUBLICATIONS

Ming L. Yu et al.; Surface reactions in the chemical vapor deposition of Tungsten using WF6 and SiH4 on Al PtSi and TiN; vol. 69, No. 2; pp. 1055–1061; Jan. 1990.*

E.J.McInerney et al.; The rate mechanisms of Silane Reduced CVD Tungsten–Materials Research Society;Confrerence Proceeding ULSI–VII; pp. 61–74; Oct. 1991.*

Thomas E. Clark et al., *High Pressure Blanket CVD Tungsten–Materials Research Society*; VLSI V.; pp. 167–177; Sep. 1989.

Ming L. Yu et al.; *Surface reactions in the chemical vapor deposition of tungsten using $WF_6$ and $SiH_4$ on Al, PtSi, and TiN*; vol. 67, No. 2; pp. 1055–1061; Jan. 1990.

Stanley Wolf and Richard N.Tauber; *Silico Processing for the VLSI Era, vol. 2—Process Integration*; pp. 398–399; 1990.

E.J. McInerney et al.; *The Rate Mechanisms of Silane Reduced CVD Tungsten–Materials Research Society*; Conference Proceedings ULSI–VII; pp. 61–74; Oct. 1997.

Novellus Systems; *Tungsten CVD Process Guide–Novellus*; pp. 2:19–22; Dec. 1997.

* cited by examiner

*Primary Examiner*—David Nelms
*Assistant Examiner*—Dung A Le
(74) *Attorney, Agent, or Firm*—Timothy M. Honeycutt

(57) ABSTRACT

A tungsten gate electrode and method of fabricating the same are provided. In one aspect, a method of fabricating a circuit device in an opening in an insulating film on a substrate is provided. The method includes depositing a film of amorphous silicon and amorphous tungsten in the opening, and thereafter depositing a film of polycrystalline tungsten on the film and annealing the substrate to react the amorphous silicon with the amorphous tungsten to form tungsten silicide on the insulating film and to increase the grain structure of the polycrystalline tungsten film. The tungsten silicide film and the polycrystalline tungsten film may be planarized to the insulating film. The method enables the seamless fabrication of an adhesion layer and a tungsten conductor structure in a single chamber and without resort to titanium.

11 Claims, 2 Drawing Sheets

TUNGSTEN INTERCONNECT METHOD

BACKGROUND OF THE INVENTION

1. Field of the Invention

This invention relates generally to semiconductor fabrication, and more particularly to a tungsten interconnect and methods of fabricating the same.

2. Description of the Related Art

Modern integrated circuits routinely contain millions of individual transistors and other electronic components. Most of the interconnections for the numerous individual transistors in a modern integrated circuit are provided via one or more metallization layers that serve as global interconnect levels. Each metallization layer is ordinarily deposited on the substrate of the integrated circuit as a single continuous layer that is thereafter patterned lithographically and etched to remove metal from areas where metal lines are not required.

In addition to the one or more metallization layers, modern integrated circuits also incorporate numerous routing-restricted interconnect levels commonly known as local interconnects. Local interconnects are used for short metallization runs such as those that locally interconnect gates and drains in NMOS and CMOS circuits and those that connect a given metallization layer to a particular structure in the integrated circuit.

A method frequently employed to form local interconnect structures involves a damascene process in which the substrate containing the integrated circuit is coated with a layer of dielectric material that is lithographically patterned and etched to form trenches in the dielectric layer where the local interconnect structures will be deposited. For example, a local interconnect structure intended to interconnect the source or drain of a transistor requires a trench to be formed in the overlying dielectric layer that extends down to the source or drain. Thereafter, a conducting contact or interconnect is formed in the trench.

Doped polysilicon and tungsten represent two conventionally used materials for global and local interconnect structures. Both materials have high melting points and thus alleviate many thermal budgeting problems associated with other commonly used conducting materials. Tungsten is frequently favored over polysilicon as its resistivity may be as much as one or more orders of magnitude lower than comparably sized doped polysilicon structures.

Despite the several advantages offered by tungsten as an interconnect material, the integration of tungsten into semiconductor processing involves a number of significant challenges. Tungsten exhibits poor adhesion to oxide. Accordingly, the conventional fabrication of a tungsten conducting structure in a trench in an oxide film requires an initial deposition of a barrier or adhesion layer on the oxide in advance of the tungsten deposition. The barrier layer material is selected to exhibit acceptable adhesion to the underlying oxide and the later-deposited tungsten film.

Titanium nitride is a common material used for a barrier layer, although other titanium based films, such as Ti:W have been used as well. In one conventional process, a thin film of titanium is deposited by physical sputtering. Thereafter a thin film of titanium nitride is deposited on the titanium by chemical vapor deposition ("CVD").

In many conventional processes, the tungsten film is deposited by the CVD reduction of $WF_6$ in a silane ambient. In at least one conventional process, the barrier film is exposed to a flow of silane for short period. The initial flow of silane is stopped and thereafter the film is exposed to a simultaneous flow of silane, $WF_6$ and hydrogen. The second silane flow is maintained at a relatively constant flow rate that is designed to establish a tungsten nucleation film on the barrier layer. The difficulty with this approach is the potential for non-conformal tungsten deposition in the trench. At relatively high silane flow rates, tungsten may deposit at a higher rate near the top of the trench than at the bottom, resulting in a bridge-over of the trench opening and the creation of a void in the tungsten interconnect. Such voids may adversely impact the performance of the interconnect.

Another shortcoming of conventional tungsten interconnect processing stems from the highly reactive character of titanium and the chemistry associated with CVD tungsten. As noted above, many conventional CVD tungsten deposition processes involve the reduction of $WF_6$ in silane. This reduction process liberates quantities of fluorine which may readily diffuse into the underlying titanium based barrier film and react with the titanium therein. The incorporation of $TiF_x$ compounds into the adhesion layer may not only degrade the resistivity of the barrier layer, but also result in the ultimate delamination of the barrier glue layer from the underlying oxide layer. This can produce not only undesirable device performance but also catastrophic device failure depending upon the extent of the delamination.

The problem of fluorine attack may be more pronounced in circumstances where the barrier film is deliberately fabricated with a small thickness or has thickness variations due to process control issues. Device scaling frequently calls for the commensurate scaling of interconnect structures. In these circumstances, an attendant decrease in barrier film thickness is normally required if acceptable levels of interconnect resistivity are to be maintained. In addition, sometimes unavoidable process control variations in the etching of the interconnect trench may produce thin spots in the barrier film. Variations in trench topography may result in variations, including thin spots, in the thickness of the deposited barrier film. These thin spots represent areas that may be particularly susceptible to fluorine attack.

The present invention is directed to overcoming or reducing the effects of one or more of the foregoing disadvantages.

SUMMARY OF THE INVENTION

In accordance with one aspect of the present invention, a method of fabricating a circuit device in an opening in an insulating film on a substrate is provided. The method includes forming a film of amorphous silicon and amorphous tungsten in the opening. A film of polycrystalline tungsten is formed on the film of amorphous silicon and amorphous tungsten and the substrate is annealed to react the amorphous silicon with the amorphous tungsten to form tungsten silicide on the insulating film and to increase the grain structure of the polycrystalline tungsten film.

In accordance with another aspect of the present invention, a method of fabricating a tungsten conductor structure in an opening in an oxide film on a substrate is provided that includes depositing a film of amorphous silicon and amorphous tungsten in the opening, and thereafter depositing a film of polycrystalline tungsten on the film and annealing the substrate to react the amorphous silicon with the amorphous tungsten to form tungsten silicide on the insulating film and to increase the grain structure of the polycrystalline tungsten film. The tungsten silicide film and the polycrystalline tungsten film are planarized substantially to the insulating film.

In accordance with another aspect of the present invention, a circuit device is provided that includes a substrate, an insulating film on the substrate that has an opening and a tungsten silicide film on the insulating film that has a sufficient amount of unbonded silicon to bond the tungsten silicide film to the insulating film. A tungsten film is positioned on the tungsten silicide film.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
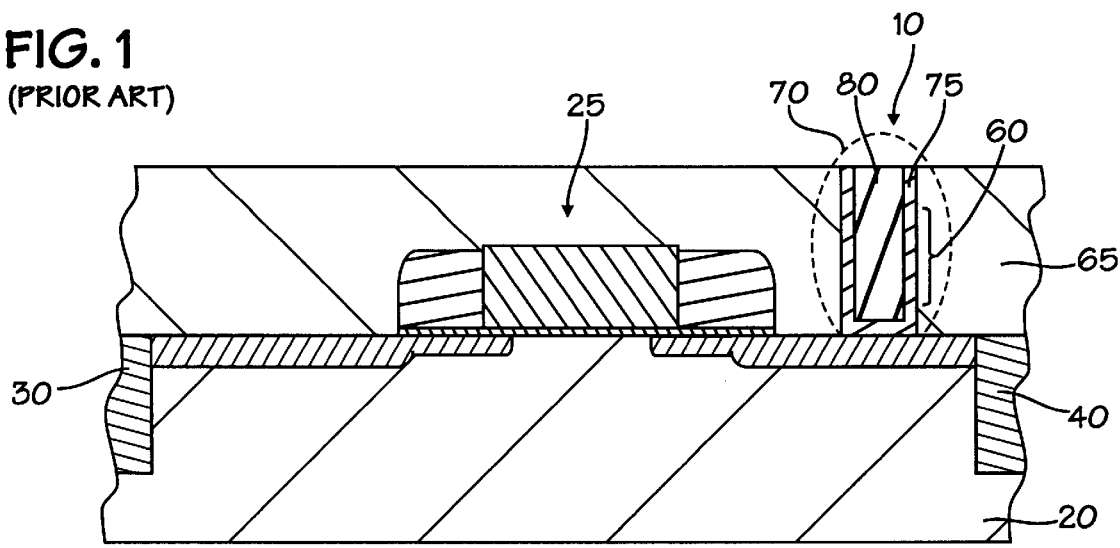
FIG. 1 is a cross-sectional view of an exemplary conventional tungsten contact fabricated on a semiconductor substrate.

In the drawings described below, reference numerals are generally repeated where identical elements appear in more than one figure. FIG. 1 depicts a cross-sectional view of an exemplary conventional tungsten contact 10 fabricated on a semiconductor substrate 20. The contact 10 is depicted adjacent to an integrated circuit transistor 25 that is fabricated on the substrate 20 and electrically isolated laterally by isolation structures 30 and 40. The transistor 25 is depicted as a field effect transistor with a source 50 and a drain 55. The tungsten contact 10 is formed in a via 60 in an oxide interlevel dielectric layer 65, which is formed over the transistor 25.

Figure 2:
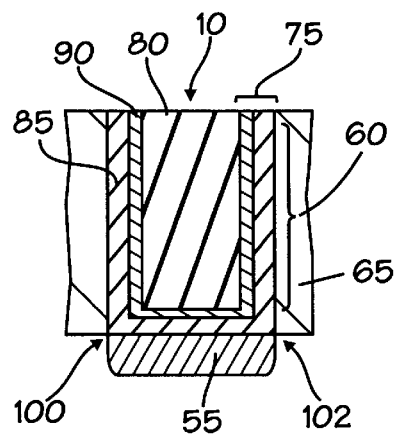
FIG. 2 is a magnified cross-sectional view of a portion of FIG. 1.

The detailed structure of the tungsten contact 10 may be understood by referring now also to FIG. 2, which is a magnified view of the portion of FIG. I circumscribed by the dashed oval 70. The tungsten contact 10 consists of an adhesion layer 75 formed in the via 60 and a tungsten plug 80 formed on the adhesion layer 75. The adhesion layer 75 consists of a sputtered titanium film 85 and a CVD titanium nitride film 90 formed on the titanium film 85.

An exemplary process flow for fabricating the contact 10 will now be described. Initially, the via 60 is established in the interlevel dielectric layer 65 by directional etching. As the skilled artisan will appreciate, sometimes unavoidable variations in process control in the etching process may lead to topographical imperfections in the sidewalls and bottom of the via 60, and particularly at the lower corners 100 and 102 of the via 60. Any such imperfections in the topography of the sidewalls and/or the bottom of the via 60 may lead to variations in the thickness of the subsequently deposited adhesion film 75.

The adhesion layer 75 is next formed by performing a physical vapor deposition of a thin film of titanium followed by a CVD of titanium nitride on the titanium film to leave the completed barrier film 85. As noted above, any topographical imperfections in the sidewalls and bottom of the via 60 may lead to variations in the thickness of the adhesion film 75 within the confines of the via 60. Such thin spots may be vulnerable to attack by fluorine atoms during the reduction of $WF_6$ in conjunction with the later deposition of tungsten.

Irrespective of the exact composition of the underlying adhesion layer 75, the tungsten conductor 80 is next deposited on the adhesion layer 75 in a CVD process involving the reduction of $WF_6$ gas in the presence of $SiH_4$ and $H_2$ gas. The reducing ambient is initially primarily silane. As the process progresses, the percentage of silane is reduced and the percentage of hydrogen is correspondingly increased to complete the reduction and deposition process. The result is the formation of a polycrystalline tungsten film 80 on the adhesion layer 75. As noted above, the difficulty with this conventional approach for fabricating a tungsten contact is the propensity for the adhesion layer 75 to delaminate from the underlying interlevel dielectric layer 65 as a result of the formation of $TiF_x$ compounds in the adhesion layer 75. The Formation of $TiF_x$ compounds is an unwanted byproduct of the diffusion of fluorine atoms from the $WF_6$ reduction process into the adhesion layer 75. The diffused fluorine atoms may readily react with the highly reactive titanium, which is present in the layer 75 as elemental titanium, as titanium nitride or both.

Figure 3:
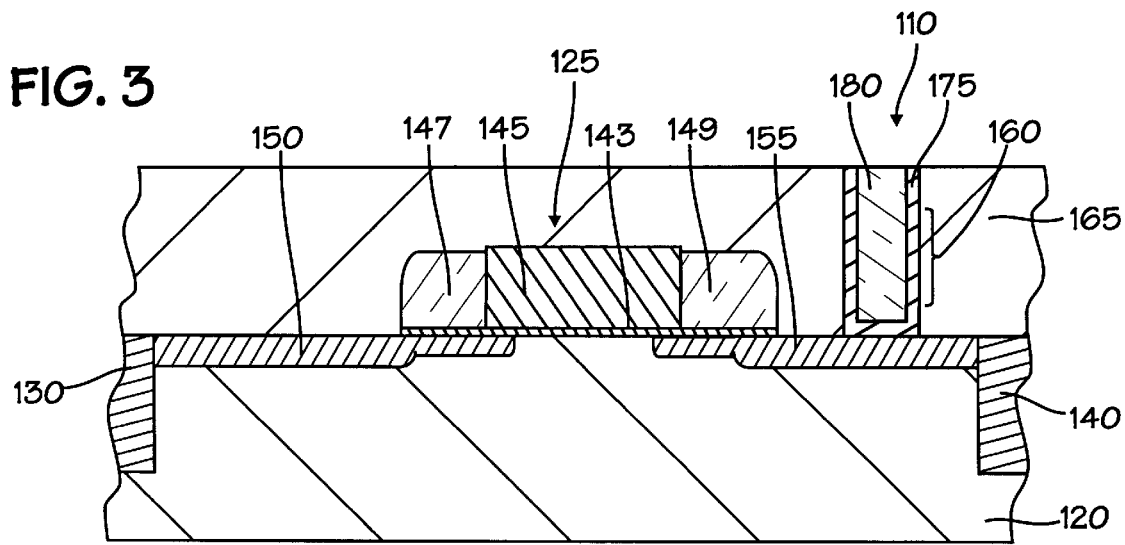
FIG. 3 is a cross-sectional view of an exemplary embodiment of a tungsten conductor structure fabricated on a semiconductor substrate in accordance with the present invention.

FIG. 3 depicts a cross-sectional view of an exemplary embodiment of a tungsten conductor structure 110 fabricated on a semiconductor substrate 120 in accordance with the present invention. The substrate 120 may be composed of p-doped silicon, n-doped silicon, silicon-on-insulator or other suitable substrate materials. The structure 110 is depicted adjacent to an integrated circuit transistor 125 that is fabricated on the substrate 120 and electrically isolated laterally by isolation structures 130 and 140. The isolation structures 130 and 140 may be trench isolation structures, field oxide regions or the like. The transistor 125 includes a gate insulating layer 143 formed on the substrate 120 and a gate electrode 145 formed on the gate insulating layer 143. The gate insulating film 143 may be composed of oxide, silicon nitride, laminates of these or other well known gate insulating film materials, and may be fabricated by well known techniques. The gate electrode 145 may be composed of a variety of conducting materials, such as, for example, polysilicon, amorphous silicon, aluminum, tantalum, tungsten or the like, and may be applied using well known techniques. The gate electrode 145 is bracketed by a pair of insulating spacers 147 and 149, which may be oxide, silicon nitride or other well known spacer materials, and may be applied and shaped by well known techniques. A pair of dual-graded source/drain regions 150 and 155 are formed in the substrate 120 using well known techniques. The phrase "source/drain region(s)" is used herein to describe a region that may serve as either a source or a drain. The skilled artisan will appreciate that a source/drain region may function as a source or a drain depending upon how it is interconnected with subsequent metallization.

The tungsten conductor structure 110 is formed in an opening 160 in an interlevel dielectric layer 165. The interlevel dielectric layer 165 may be composed of oxide, tetra-ethyl-ortho-silicate ("TEOS") or other insulating materials. The opening 160 may be a via or trench suitable for accommodating a local interconnect, a conducting line or other conducting structure as desired. The tungsten conductor structure 110 consists of a tungsten silicide adhesion layer 175 formed in the opening 160 and a tungsten structure 180 formed on the adhesion layer 175. The tungsten silicide adhesion layer 175 contains a sufficient amount of unbonded silicon atoms which adhere to the underlying interlevel dielectric layer 165, and a majority concentration of tungsten silicide to which the overlying tungsten conductor 180 readily adheres. It should he understood that the depiction of the transistor 125 and the interlevel dielectric layer 165 in conjunction with the tungsten conductor structure 110 is intended to be merely illustrative of both possible structures and fabrication processes in accordance with the present invention. The skilled artisan will appreciate that the tungsten conductor structure 110 may be used in a wide variety of situations in circuit device fabrication where a conductor structure is needed.

Figure 4:
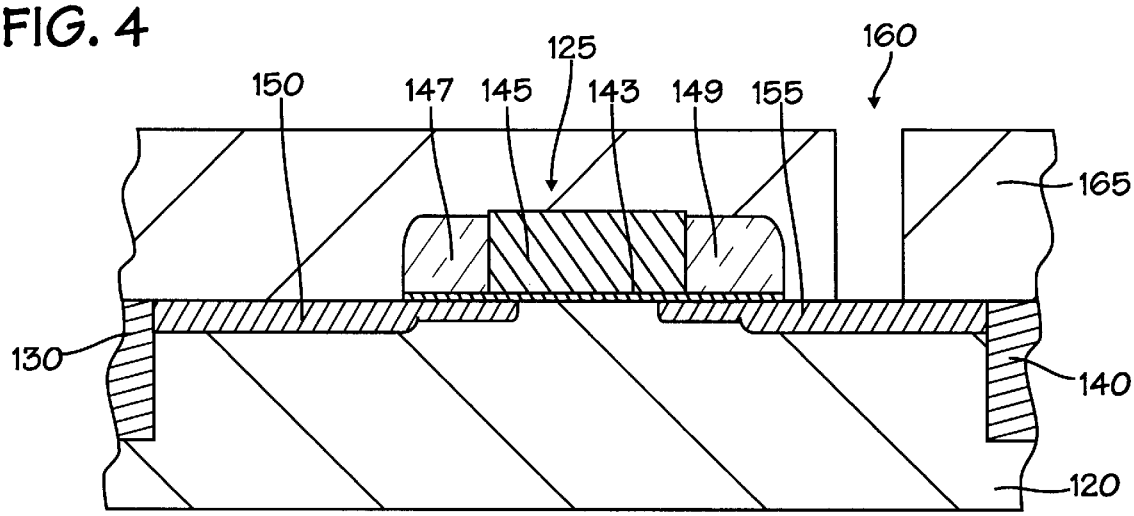
FIG. 4 is a cross-sectional view of the substrate depicted in FIG. 3 depicting the formation of an opening in an interlevel dielectric layer in accordance with the present invention.
Figure 5:
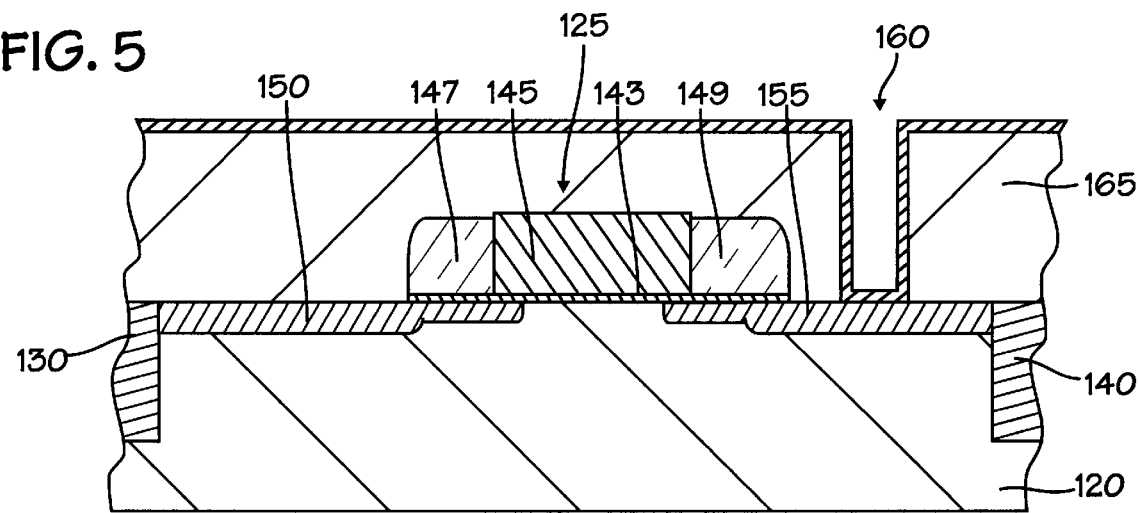
FIG. 5 is a cross-sectional view like FIG. 4 depicting the formation of an adhesion film in the opening in accordance with the present invention.
Figure 6:
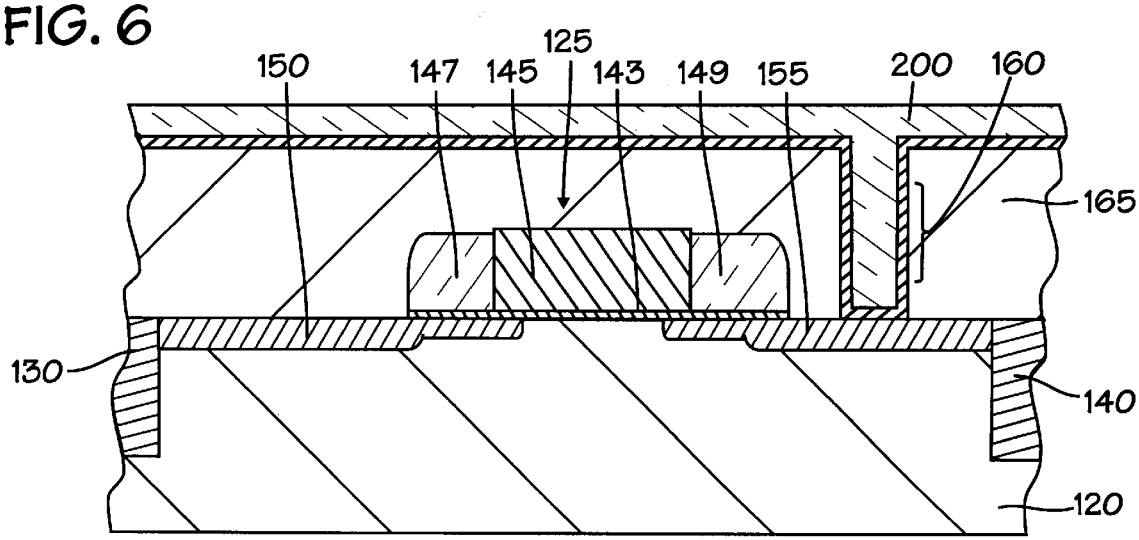
FIG. 6 is a cross-sectional view like FIG. 5 depicting the formation of a polycrystalline tungsten film on the adhesion layer in accordance with the present invention.

An exemplary process flow for fabricating the tungsten conductor structure 110 in accordance with the present invention may be understood by referring now to FIGS. 4, 5 and 6, and initially to FIG. 4. Initially, the opening 160 is established in the interlevel dielectric layer 165 by directional etching by, for example, chemical plasma etching, reactive ion etching, or the like. Well known etch chemistries tailored to the material used to form the film 165 may be used.

The fabrication of the adhesion layer 175 and the tungsten structure 180 depicted in FIG. 3 may be understood by referring now to FIGS. 5 and 6, which depict two stages of a CVD reduction of $WF_6$ in silane and hydrogen. Initially, and as depicted in FIG. 5, a mixture of $WF_6$ and $SiH_4$ is flowed over the interlevel dielectric layer 165 for a relatively short period of time at a chamber temperature of about 300° to 400° C. and pressure of about 100 to 300 mtorr. The $SiH_4$-to-$WF_6$ ratio is kept high enough to produce a deposition of a combination of amorphous silicon ($\alpha$-Si) and amorphous tungsten ($\alpha$-W). The purpose of the high $SiH_4$-to-$WF_6$ ratio is to ensure that the deposition produces $\alpha$-Si and $\alpha$-W along with a sufficient amount of unbonded silicon atoms. It is desirable for silicon to be present in the film 175 in non-stoichiometric quantities relative to the tungsten so that a subsequently performed anneal to convert the $\alpha$-W to tungsten silicide does not consume all of the available $\alpha$-Si. The unbonded silicon remaining after the anneal will enable the film 175 to readily adhere to the underlying interlevel dielectric layer 165.

After the initial flow of high ratio $SiH_4$-to-$WF_6$, the flow of $SiH_4$ is cutoff and a flow of hydrogen gas is commenced while the flow of $WF_6$ is continued to produce a polycrystalline tungsten film 200 as shown in FIG. 6. Through subsequent processing described below, the film 200 is planarized to yield the structure 110 depicted in FIG. 3. The polycrystalline structure will yield more favorable resistivity than a more amorphous grain structure. The film 200 will be deposited to a greater thickness than the $\alpha$-Si and $\alpha$-W film 175, although the thicknesses of both films 200 and 175 are largely matters of design discretion. In an exemplary embodiment, the tungsten film 200 will have a thickness that is approximately twenty times the thickness of the underlying adhesion layer 175.

The requisite flow periods for the $SiH_4$-$WF_6$ and $H_2$-$WF_6$ flows will depend in large part on the particular type of tool used, the desired thicknesses for the films 175 and 200 and the desired deposition rates. Experiment in an Applied Materials Endura tool set to yield deposition rates of between about 10 Å/s and 200 Å/s has shown that a flow of $SiH_4$ and $WF_6$ with a $SiH_4$-to-$WF_6$ ratio of greater that about 2:1 yields an $\alpha$-Si and $\alpha$-W film 175 with a sufficient amount of free silicon therein, and a subsequent flow of $H_2$ and $WF_6$ with a $H_2$-to-$WF_6$ ratio of about 20:1 yields a good quality polycrystalline tungsten film 200. For assumed thicknesses for the films 175 and 200 of 200 Å and 4000 $\alpha$ respectively, and tool flow rates tuned to yield a deposition rate of about 10 Å/s, the 2:1 $SiH_4$-to-$WF_6$ ratio flow may be carried out for about 20 seconds and the 20:1 $H_2$-to-$WF_6$ ratio flow for about 400 seconds.

Still referring to FIG. 6, the substrate 120 is next annealed at about 500 to 1100° C. The anneal produces a chemical reaction between the $\alpha$-Si and the $\alpha$-W in the film 175 which produces tungsten silicide with the generic chemical formula $W_xSi_y$, specific examples of which may be $W_5Si_3$ and $WSi_2$. Because the process of depositing the film 175 results in non-stoichiometric quantities of silicon and tungsten in the film 175, there will be excess and unbonded silicon atoms in the film 175 following the anneal which readily adhere the film 175 to the underlying oxide-based layer 165. The anneal also increases the average grain size of the overlying polycrystalline tungsten film 200, which will result in an improvement in the electrical resistivity of the subsequently formed tungsten structure 180 (See FIG. 3). The anneal may be performed for about 30 to 90 minutes in a furnace process or for about 5 to 75 seconds in a rapid thermal anneal process. Thermal budgeting considerations should be taken into account in selecting the anneal temperature.

Referring still to FIG. 6 and again to FIG. 3, following the deposition of the tungsten film 200, a planarization process may be performed to yield the defined tungsten conductor structure 110 depicted in FIG. 1. The films 200 and 175 may be planarized substantially to the interlevel dielectric layer 165. Well known planarization techniques may be used, such as etchback planarization, chemical-mechanical-polishing, combinations of these or the like.

Optionally, the anneal of the film 175 described above in conjunction with FIG. 6 may be performed after the planarization process used to define the completed structure 110.

The process of the present invention eliminates titanium as an adhesion layer material, thus eliminating the potential for delamination due to titanium-fluorine reactions. In addition, the process of the present invention provides for the seamless production of a tungsten interconnect structure and underlying adhesion layer by merely changing the ratio of $WF_6$ and silane flows into the CVD chamber. In this way, a separate process for establishing a titanium based adhesion layer, which ordinarily requires the use of a separate tool and workpiece movements for depositing both tungsten and titanium is eliminated.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of fabricating a circuit device in an opening in an insulating film on a substrate, comprising:

forming a film of amorphous silicon and amorphous tungsten in the opening;

forming a film of polycrystalline tungsten on the film of amorphous silicon and amorphous tungsten; and annealing the substrate to react the amorphous silicon with the amorphous tungsten to form tungsten silicide on the insulating film and to increase the grain structure of the polycrystalline tungsten film.

2. The method of claim 1, wherein the insulating film comprises oxide.

3. The method of claim 1, wherein the film of amorphous silicon and amorphous tungsten is deposited by exposing the insulating film to an ambient of $WF_6$ and $SiH_4$.

4. The method of claim 3, wherein the ratio of $SiH_4$ to $WF_6$ is greater than about 2.

5. The method of claim 3, wherein the film of polycrystalline tungsten is deposited by exposing the film of amorphous silicon and amorphous tungsten to an ambient of $WF_6$ and hydrogen with a ratio of hydrogen to $WF_6$ being low enough to deposit polycrystalline tungsten.

6. The method of claim 1, wherein the film of amorphous silicon and amorphous tungsten is formed in contact with a transistor source/drain region.

7. A method of fabricating a tungsten conductor structure in an opening in an oxide film on a substrate, comprising:

forming a conductor film in the opening by initially depositing a film of amorphous silicon and amorphous tungsten, and thereafter depositing a film of polycrystalline tungsten on the film and annealing the substrate to react the amorphous silicon with the amorphous tungsten to form tungsten silicide on the oxide film and to increase the grain structure of the polycrystalline tungsten film; and planarizing the film of amorphous silicon and amorphous tungsten and the film of polycrystalline tungsten substantially to the oxide film.

8. The method of claim 7, wherein the film of amorphous silicon and amorphous tungsten is deposited by exposing the insulating film to an ambient of $WF_6$ and $SiH_4$.

9. The method of claim 8, wherein the ratio of $SiH_4$ to $WF_6$ is greater than about 2.

10. The method of claim 8, wherein the film of polycrystalline tungsten is deposited by exposing the film of amorphous silicon and amorphous tungsten to an ambient of $WF_6$ and hydrogen with a ratio of hydrogen to $WF_6$ being low enough to deposit polycrystalline tungsten.

11. The method of claim 7, wherein the planarizing is by chemical mechanical polishing.

* * * * *